United States Patent [19]
Hanks

[11] Patent Number: 5,216,690
[45] Date of Patent: Jun. 1, 1993

[54] ELECTRON BEAM GUN WITH GROUNDED SHIELD TO PREVENT ARC DOWN

[76] Inventor: Charles W. Hanks, c/o Electric Beam Technology, 3661 Willowick Dr., Ventura, Calif. 93003-1051

[21] Appl. No.: 850,686

[22] Filed: Mar. 11, 1992

[51] Int. Cl.⁵ .......................................... H01J 37/305
[52] U.S. Cl. ....................................... 373/10; 373/14; 373/11; 219/121.26; 392/389; 118/726; 313/313; 313/626
[58] Field of Search ........................ 373/10, 13, 14, 11; 219/121.25, 121.27, 121.26; 392/388, 389; 118/726, 50.1; 427/37, 35–36, 38, 39; 313/313, 626, 239, 240, 479

[56] References Cited

U.S. PATENT DOCUMENTS

| | | | |
|---|---|---|---|
| 3,008,027 | 11/1961 | Beckius et al. | 373/10 |
| 3,286,021 | 11/1966 | Koch | 219/121.27 |
| 3,486,064 | 12/1969 | Stauffer | 219/121.27 |
| 3,678,334 | 7/1972 | Dugdale et al. | 219/121.27 |
| 3,883,679 | 5/1975 | Shrader et al. | 373/13 |
| 4,835,789 | 5/1989 | Hanks | 373/14 |

FOREIGN PATENT DOCUMENTS

| | | | |
|---|---|---|---|
| 59-143247 | 8/1984 | Japan | 219/121.27 |
| 1257015 | 12/1971 | United Kingdom | 118/726 |

OTHER PUBLICATIONS

"The Book of Basics", Material Research Corp, (unknown date) Orangeburg, N.Y. 10962, pp. B-I-8 thru B-I-10 and B-III-15, 16.

*Primary Examiner*—Bruce A. Reynolds
*Assistant Examiner*—John A. Jeffery
*Attorney, Agent, or Firm*—Julian Caplan

[57] ABSTRACT

A grounded metallic shield which comprises an electrode enclosing the filament leads and emitters of an e-Gun in a high vacuum chamber of the type used in melting and casting metals and other materials and evaporation sources. The shield is spaced from the filament leads and emitters a distance in the order of the electron mean free path for the pressure uses within the high vacuum chamber. The structure and method of use thereof suppresses or eliminates arc-downs or glow discharges.

12 Claims, 1 Drawing Sheet

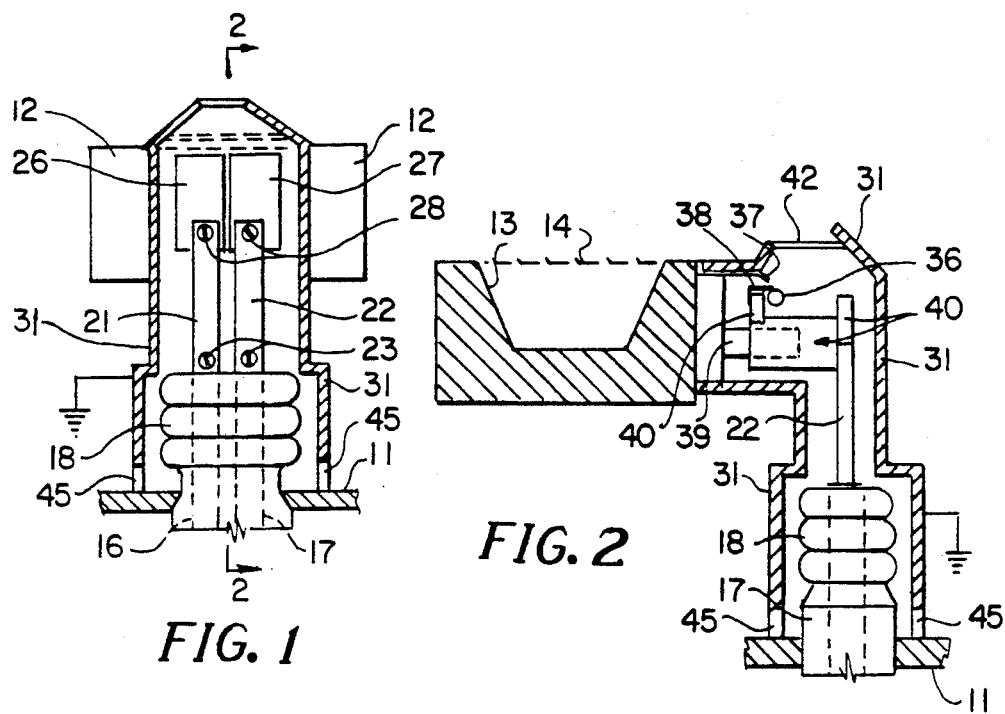
FIG. 1
FIG. 2
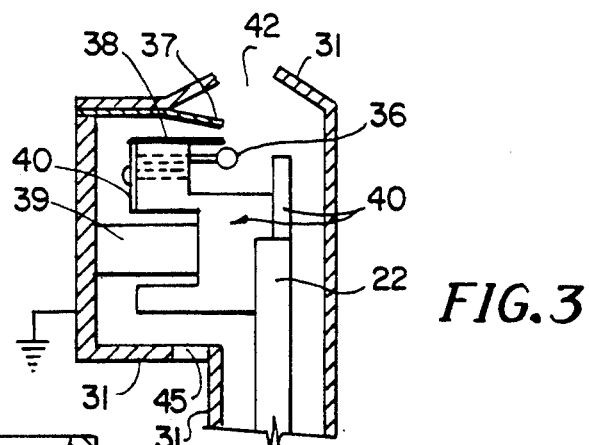
FIG. 3
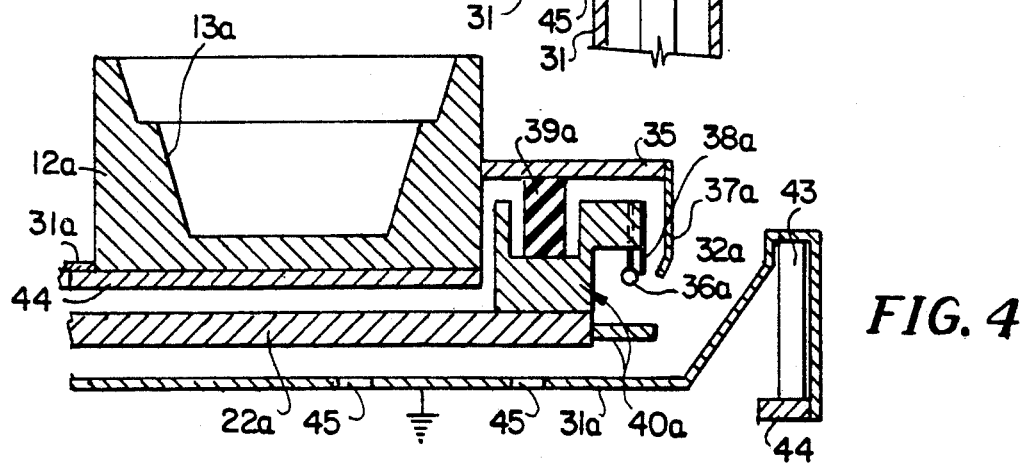
FIG. 4

ELECTRON BEAM GUN WITH GROUNDED SHIELD TO PREVENT ARC DOWN

BACKGROUND OF THE INVENTION

1. Field of the Invention

This invention relates to a new and improved electron gun structure which uses high direct current negative voltage (HV) to form high energy electron beams for melting and casting of many different materials and for high vacuum evaporation sources for producing thin-film coatings on various substrates. More particularly, the invention relates to the use of a grounded metallic shield which functions as an electrode enclosing the filament leads and emitter structures of an e-Gun in a high vacuum chamber.

2. Description of Related Art

Vacuum furnaces conventionally employ e-Guns in the melting or casting of metals and other materials, employing HV as high as 50 KV and ingots as large as 10 tons. Vacuum furnaces may also be used in a high vacuum electron beam heated evaporation source in the manufacture of thin-film devices such as ¼-wave stacks for the optics industry, or integrated circuits, and many other devices which use thin-film technology as part of the fabrication process. In this type of process, the HV value is as low as 4 KV and has a nominal value of 10 KV.

It has been found that in both types of e-Beam operations the operation can be disrupted by the buildup of an arc or glow discharge of the HV. This has an adverse effect in that the voltage can drop as low as a few hundred volts and the current flow rise to a level limited only by the ability of the external and PS circuits to provide the current.

The aforesaid arc or glow is caused by the fact that all conductive surfaces with negative HV impressed upon them in vacuum have a loss of a small number of electrons from such surfaces flowing outward to grounded surfaces, such as chamber walls and internal furnace equipment. Depending upon the pressure within the chamber, an electron may ionize many gas atoms at its energy threshold of about every 20 volts of its path from $-10$ KV to 0, or a potential tally of about 500 ions and a like number of electrons. In addition, the total current flow is further augmented by the flow of all the electrons from the ionized atoms and accompanying electrons from their part of the ion formation processes. This effect is known as a "Geiger Discharge" and is of a proportion whose current is limited only by the external circuits. The initial discharge current is augmented by the large numbers of secondary electrons liberated from the HV negative surfaces being bombarded by positive ions which are attracted to the negative voltage.

The foregoing has been a problem in the high voltage industry which has not, heretofore, been satisfactorily prevented.

One attempt at diminishing the start of arcing was performed by University of California physicists in about 1944 in connection with Calutron uranium isotope separation chambers. These attempts used insulators to hold down equipment parts comprising end cups with side skirts to reduce the amount of coating on the insulators. It was found that the amount of arcing around insulator ends diminished when the negative end was covered by a cap which reduced the voltage gradient impressed on the end surfaces. However, this phenomena is different from the present invention in that the negative end has HV impressed on it. The finite resistance of the insulator has a small flow of electrons down toward the positive end. A reduction in voltage gradient at the metal-ceramic interface of the insulator and the surrounding metal reduces arcing in that area but only in that area. Thus that development is contrary to the teaching of the present invention where applicant is covering HV surfaces with grounded structures.

As developments of e-Beam heated evaporators occurred around 1954, the solution accepted for reducing arc-downs was installation of a large size power resistor in the HV lead between the power supply and the e-Gun to limit the current flow to a low value where it rapidly self-quenched. Thus these attempts were aimed at limiting the current available to the arcs as a means of cessation and restoring power.

Steinmetz, in about 1915, had controlled the maximum current flow in a series of street arc lamps, and this was later adopted in a monocyclic resonant network to maintain a constant current flow with increased current demand resulting in HV dropping.

A faster and similar electronic current control device became available with the development of electronic power triodes and Tetrodes with the capability of several hundred KW capacity and voltage holding levels nearing 50 KV. The control function in this instance was merely that of monitoring the current flowing through the power supply and any increase, no matter how sudden, fed voltage into the tube grid circuit to shut off current flow and quench the arc. Reference is made to U.S. Pat. No. 3,204,096 disclosing apparatus for projecting an electron beam along a curved path having variable impedance. In this development HV changed if the current changed.

Other control methods have been used on the primary side of the HV transformer.

All of the foregoing methods were aimed solely at controlling and minimizing arc-down effect after such effect commenced.

SUMMARY OF THE INVENTION

The present invention suppresses the commencement of an arc or glow phenomenon to prevent the amplification of electron production from a very few initial electrons into an ampere or more of them forming a large conducting current from cathode to ground.

In accordance with this invention it has been found that in a normal glow discharge, the distance that the cathode fall space extends out from the cathode is of the order of the electron mean free path. Within the length of the electron mean free path there is, probability-wise, no more than one-half ionizing collisions per electron leaving the cathode general surface. Therefore, in accordance with this invention, a "grounded" metal shield or electrode covering all HV surfaces constructed so that it does not interfere with the e-Beam action and placed at a distance of one electron mean free path or less from the HV surfaces does not permit the buildup of enough electron current for the formation of arc-downs or glow discharges.

Other than the normal very low number of electrons leaving the cathode HV negative surfaces and travelling toward the grounded surfaces, the value of the size of the electron mean free path dictates that there are not enough gas atoms in the above path to provide current amplification to anywhere near the amount needed for imitation of the arc and glow phenomena. This effect occurs because with almost no ionization electrons, essentially no photo-electric electrons from positive ion bombardment of cathode surfaces, and very few electrons needed for recombination with ions, there is almost no current flow from HV to ground.

An experiment to prove the above was conducted. An accurate micrometer was placed in series connection in the HV lead-in to the vacuum chamber to monitor current flow caused by the presence of the HV on the surfaces. The following is a table showing the micrometer readings at different pre-selected pressures.

| | CHAMBER PRESSURE | |
|---|---|---|
| TORR | PASCALS | MICROAMPERES |
| $18 \times 10^{-3}$ | 2.4 | 20–80 |
| $22 \times 10^{-3}$ | 2.8 | 90–130 |
| $25 \times 10^{-3}$ | 3.3 | 175–250 |

The "pre-selected vacuum" mentioned above and used in the claims is for practical purposes 50 to 150 times higher than the theoretical operating pressure and the distance the shield is spaced from the HV surfaces is calculated at the higher pressures. More particularly, "pre-selected vacuum" refers to the chamber pressure in use for coating or melting operations. These pressures are about 100 or 150 times lower than the pressures that the arc-down-free mode should be able to operate at successfully if the electron mean free path is calculated at and the ground shield spacing is made to operate at those higher pressure figures. A pressure of 0.5 to 5.0 Pascals limits the general range—covering dimensions of 10.3 cm to 1.26 cm. For practical purposes ¼ in. is typical.

Changes in pressure occur in vacuum chambers reaching a factor of 100 or more. Local heating of surfaces, hidden joints between plates, trapped gas in blind-tapped bolt holes bleeding out and so forth routinely occur. Initiation of arc or glow generates more heat to further exacerbate the gas producing mechanism. Hence in calculating the spacing between the shield and the HV surface in accordance with mean free path, it is necessary to use a shorter spacing distance anticipating control of 100 to 150 times the pressure increase. At low pressures where the electron mean free path is very long, arc and glow start-up will not occur, and the fact that it does not occur in present day use is attributable to local gas generation, local area of high gradient of the HV, and other factors. In accordance with the present invention, incipient arc-down has not occurred.

In connection with the use of the term "pre-selected vacuum", it should be understood that in using e-Guns for evaporation, there is a mean free path criterion which must be met for producing high quality coating. The mean free path of the furnace atmosphere should equal or be greater than the source-to-substrate distance. If not, the energy of the transiting vapor atoms may be impaired by collisions, and loss of energy to the furnace atmosphere atoms. A large distance is desirable for increased uniformity of coating thickness. Most e-Beam coaters use a figure of 25 cm for the mean free path desired to preclude formation of a "frosting" coating. It is reached at a chamber pressure of 0.03 Pascals or $2.7 \times 10^{-4}$ Torr. The distance of the grounded shield from the HV surfaces in accordance with the invention should be that of the electron mean free path at about 2 orders of magnitude higher or about 2 cm, to accommodate suppressing arc-down at a localized pressure burst of a factor of 100 or so higher.

BRIEF DESCRIPTION OF DRAWINGS

FIG. 1 is a schematic view showing a portion of a vacuum chamber employing the present invention;

FIG. 2 is a sectional view taken substantially along the line 2—2 of FIG. 1;

FIG. 3 is an enlarged view of a portion of FIG. 1;

FIG. 4 is a view similar to FIG. 2 of a modification.

DESCRIPTION OF PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention suppresses the start of the initial phases of arc or glow formation. This is accomplished by making the space available to electron flow from HV negative surfaces to zero, or ground, voltage but limited in distance to a little less than the distance of the electron mean free path at the highest chamber pressure anticipated. The electrons making the transit, although accelerating very fast going from cathode surfaces to nearby 10 KV ground, have minimal ion collision probability over that entire distance. The electrons merely transfer to ground at that spot one 10 KV electron amount of energy.

Directing attention now to the modification of FIGS. 1-3 of the accompanying drawings, a vacuum chamber is illustrated generally by a fragment of a vacuum chamber wall 11. Within the chamber is a crucible 12 formed with a hollow 13 in which is disposed a metal or other material 14 to be melted or evaporated. High voltage feed-ins 16 and 17 pass through the vacuum chamber wall 11, a conventional high-vacuum feedthrough 18 surrounding the feed-ins in order to preserve the vacuum, all as well understood in this art. Feed-ins 16 and 17 are connected to filament leads 21 and 22, respectively, by attachment screws 23 or other conventional means. Attached to each lead 21,22 is an emitter structure 26,27 also connected by attachment screws 28 or other conventional means. The normal function of such a structure is to bombard the metal or other material 14 in the crucible 12 with electrons from the aforementioned electron gun. Such bombardment causes either melting or evaporation of the metal or other material 14, all as well understood in this art.

Directing attention now to the details of the emitter structure 40 shown in FIG. 3, filament 36 and anode 37 cause emission guided by the beam former electrode 38 which is insulated by HV insulator 39. The beam path opening 42 is formed in the shield 32 by the initiation of the electron beam.

The following is a partial table of electron mean free paths at various pressures.

| PRESSURE | | MEAN FREE PATH | |
|---|---|---|---|
| PASCALS | TORR | GAS Cm | ELECTRON Cm |
| 10 | $75 \times 10^{-3}$ | 0.09 | 0.5 |

-continued

| PRESSURE | | MEAN FREE PATH | |
|---|---|---|---|
| PASCALS | TORR | GAS Cm | ELECTRON Cm |
| 5 | $37.5 \times 10^{-3}$ | 0.18 | 1.26 |
| 2 | $15.0 \times 10^{-3}$ | 0.45 | 2.57 |
| 1 | $7.5 \times 10^{-3}$ | 0.9 | 5.2 |
| 0.5 | $3.75 \times 10^{-3}$ | 1.8 | 10.3 |
| 0.13 | $1.0 \times 10^{-3}$ | 6.8 | 38.8 |
| 0.1 | $7.5 \times 10^{-4}$ | 9.07 | 52. |
| 0.01 | $7.5 \times 10^{-6}$ | 90.7 | 517. |

The vacuum chamber is at different pressures depending upon the use to which the electron gun is put.

In accordance with the present invention, a metallic shield 31 is installed around all of the HV elements and specifically the lead-ins 21,22, feed through 18 and emitter structure 26,27. The spacing between the shield 31 and the aforesaid elements (herein referred to as "HV elements") is less than the mean free path at a pressure of 4 or more Pascals for a vacuum coating installation. This amounts to a spacing of approximately ¼ inch between the HV surfaces and ground throughout the chamber. In practical effect, the round rod filament leads 21,22 were positioned inside a metal tube in a co-axial arrangement. The emitter structure 26,27 was encased by metal sheets, also spaced ¼ inch therefrom. Vacuum pump-out was accomplished by forming slit-like openings 45 at ends and bends (not shown), the openings 45 being sufficiently small to maintain the electron mean free path in question. The beam itself makes a small hole 32 where it exits from the shield 31 in its path into the crucible 12.

Observations made with the e-Gun system heretofore described show zero arc-downs or glow discharges when energized at chamber pressures below 4 Pascals (30 milli-Torr). Such tests were valid because the good qualities of both operating modes were tested at one time. It has been found that just after pump-down is the time of major degassing of absorbed atmospheric air and consequently is the major time of most arcing. Heating up the e-Gun filament provided a beam out of the emitter going up and curving down into the crucible 12 where it melted metal 14 placed therein.

The modification of FIGS. 1-3 shows the electron beams turning through an arc of 180° in the path from the emitter structure 40 to the material 14 in crucible 12. There is a disadvantage to this arrangement in that materials may fall through the opening 32 into the emitter structure 36. The modification of FIG. 4 shows the use of magnet 43 to cause the electron path to bend through 270°. Reference is made to U.S. Pat. No. 4,835,789 explaining one means whereby the electron beam may be caused to traverse such a path. In FIG. 4, magnet 43 is illustrative of other magnets which are dispersed around the perimeter of the crucible 12a, all resting upon the steel magnet base 44. Electrons proceeding through the opening 32a curve through 270° to reach the crucible 12a.

In many respects the elements of FIG. 4 resemble that of the preceding modification and the same reference numerals followed by the subscript are used to designate corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. In an electron beam gun within a high vacuum chamber subjected to a pre-selected vacuum, a plurality of high voltage surfaces, a metallic shield surrounding all of said high voltage surfaces, means grounding said shield, said shield being spaced from said surfaces a distance less than the mean free path of electrons at said pre-selected vacuum, said high voltage surfaces comprising filament leads and an emitter structure connected through said filament leads to a high voltage source external to said chamber, said shield being formed with a small hole in the path of electrons from said emitter to a target in said vacuum chamber, a crucible, and means to focus and direct the path of electrons from said emitter structure to said crucible over an arc passing through said small hole.

2. The chamber of claim 1 in which said filament leads comprise rods and said shield comprises at least one tube in co-axial relation to said rods.

3. The chamber of claim 1 in which said shield comprises sheets substantially enclosing said emitter.

4. The chamber of claim 1 in which said shield is formed with slits to permit vacuum pump-out of said shield.

5. The chamber of claim 1 in which said path of electrons is over an arc of approximately 270°.

6. The chamber of claim 1 in which said path of electrons is over an arc of approximately 180°.

7. In combination, means including a wall to form a vacuum chamber, a crucible shaped with a hollow suitable for containing a target material, means for subjecting said chamber to a pre-selected vacuum, a plurality of high voltage feed-ins leading from an external high voltage source through said wall into said chamber, a feedthrough for said feed-ins, filament leads connected to said feed-ins, an emitter structure connected to said filament leads, and a metallic shield grounded relative to said crucible surrounding said filament leads, said emitter structure, said feedthrough and all other high voltage surfaces within said chamber other than said crucible, said shield being spaced from said filament leads, from said emitter structure and said feedthrough a distance less than the mean free path of electrons at said pre-selected vacuum, said shield being formed with a small hole in the path of electrons from said emitters to said target material, and beam directing means to focus and direct said path of electrons in an arcuate path from said emitter structure through said small hole and into said hollow of said crucible.

8. The combination of claim 7 in which said shield is formed with slits to permit vacuum pump-out within said shield by said means for subjecting said chamber to a pre-selected vacuum for melting or evaporation of said target material.

9. The combination of claim 7 in which said shield comprises at least one tube in co-axial relation to said filament leads.

10. The combination of claim 7 in which said shield comprises metallic sheets substantially enclosing said emitter structure.

11. The combination of claim 9 in which said emitter structure and said crucible are positioned relative to said small hole so that the path of electrons from said emitter structure into said crucible is over an arc of approximately 180°.

12. The combination of claim 9 in which said beam directing means comprising a plurality of magnets in said chamber, said path of electrons from said emitter structure into said crucible being over an arc of approximately 270°.

* * * * *